United States Patent
Chen et al.

(10) Patent No.: US 8,866,283 B2
(45) Date of Patent: Oct. 21, 2014

(54) CHIP PACKAGE STRUCTURE AND METHOD OF MAKING THE SAME

(75) Inventors: Wei Chen, Saratoga, CA (US); XiaoChun Tan, Shanghai (CN)

(73) Assignee: Silergy Semiconductor Technology (Hangzhou) Ltd., Hangzhou (CN)

( * ) Notice: Subject to any disclaimer, the term of this patent is extended or adjusted under 35 U.S.C. 154(b) by 231 days.

(21) Appl. No.: 13/588,254

(22) Filed: Aug. 17, 2012

(65) Prior Publication Data

US 2012/0313219 A1 Dec. 13, 2012

Related U.S. Application Data

(63) Continuation of application No. 12/928,986, filed on Dec. 24, 2010, now Pat. No. 8,294,256.

(30) Foreign Application Priority Data

Apr. 16, 2010 (CN) .......................... 2010 1 0153314

(51) Int. Cl.
*H01L 23/48* (2006.01)
*H01L 23/00* (2006.01)
*H01L 23/495* (2006.01)

(52) U.S. Cl.
CPC ....... *H01L 24/06* (2013.01); *H01L 2224/48247* (2013.01); *H01L 2924/00014* (2013.01); *H01L 2924/01005* (2013.01); *H01L 2224/49175* (2013.01); *H01L 2924/01079* (2013.01); *H01L 2924/14* (2013.01); *H01L 2924/30107* (2013.01); *H01L 2924/01028* (2013.01); *H01L 24/49* (2013.01); *H01L 2924/01075* (2013.01); *H01L 2224/85447* (2013.01); *H01L 23/4952* (2013.01); *H01L 2924/01029* (2013.01); *H01L 2224/49171* (2013.01); *H01L 2924/01014* (2013.01); *H01L 2224/49113* (2013.01); *H01L 2224/48257* (2013.01); *H01L 2224/4917* (2013.01); *H01L 2924/01006* (2013.01); *H01L 2924/19041* (2013.01); *H01L 2924/01023* (2013.01); *H01L 2924/014* (2013.01); *H01L 24/48* (2013.01); *H01L 2924/01082* (2013.01); *H01L 2924/01033* (2013.01)
USPC ............. 257/692; 257/E23.031; 257/690; 257/786; 438/123

(58) Field of Classification Search
CPC .......... H01L 2224/48091; H01L 2924/01079; H01L 2924/14
USPC ............. 257/E21.502, E21.506, E23.031, 257/E23.044, E23.057, 532, 676, 678, 684, 257/690–693, 735, 670, 672, 786; 438/107, 438/106, 121, 123, 124; 29/729
See application file for complete search history.

(56) References Cited

U.S. PATENT DOCUMENTS

| | | | |
|---|---|---|---|
| 5,343,073 A * | 8/1994 | Parthasarathi et al. | 257/666 |
| 5,457,340 A | 10/1995 | Templeton, Jr. et al. | |
| 5,866,940 A | 2/1999 | Takata et al. | |
| 6,021,081 A | 2/2000 | Higashide et al. | |

(Continued)

*Primary Examiner* — Chris Chu
(74) *Attorney, Agent, or Firm* — Michael C. Stephens, Jr.

(57) ABSTRACT

Methods and structures related to packaging a chip are disclosed. In one embodiment, a chip package structure includes: (i) a chip having a plurality of first and second contact pads thereon; (ii) a lead frame having a plurality of pins for external connection to the package structure, where the chip is disposed on the lead frame; (iii) a plurality of first bonding wires for connecting the first contact pads to the lead frame; and (iv) a plurality of second bonding wires for connecting the second contact pads to the plurality of pins on the lead frame.

12 Claims, 7 Drawing Sheets

(56) References Cited

U.S. PATENT DOCUMENTS

| | | | | |
|---|---|---|---|---|
| 6,198,163 | B1 * | 3/2001 | Crowley et al. | 257/706 |
| 6,388,311 | B1 * | 5/2002 | Nakashima et al. | 257/676 |
| 6,469,327 | B1 | 10/2002 | Yasuda et al. | |
| 6,608,375 | B2 * | 8/2003 | Terui et al. | 257/691 |
| 6,703,696 | B2 * | 3/2004 | Ikenaga et al. | 257/678 |
| 7,019,389 | B2 * | 3/2006 | Lai et al. | 257/666 |
| 7,049,696 | B2 * | 5/2006 | Kubo | 257/706 |
| 7,129,568 | B2 * | 10/2006 | Lee et al. | 257/666 |
| 7,145,222 | B2 * | 12/2006 | Gai | 257/667 |
| 7,145,223 | B2 | 12/2006 | Kunimatsu et al. | |
| 7,180,161 | B2 * | 2/2007 | Chiang et al. | 257/666 |
| 7,193,302 | B2 * | 3/2007 | Tseng | 257/678 |
| 7,425,756 | B2 * | 9/2008 | Danno et al. | 257/672 |
| 7,443,011 | B2 * | 10/2008 | Cusack et al. | 257/666 |
| 7,518,156 | B2 * | 4/2009 | Hasebe et al. | 257/98 |
| 7,646,083 | B2 * | 1/2010 | Yeung et al. | 257/670 |
| 8,169,088 | B2 | 5/2012 | Nguyen | |
| 8,383,962 | B2 * | 2/2013 | Sutardja | 174/529 |
| 8,558,398 | B1 * | 10/2013 | Seetharam | 257/784 |
| 2007/0096268 | A1 * | 5/2007 | Sharma et al. | 257/666 |
| 2007/0138609 | A1 | 6/2007 | Shiah | |

* cited by examiner

CHIP PACKAGE STRUCTURE AND METHOD OF MAKING THE SAME

RELATED APPLICATIONS

This application is a continuation of the following application, U.S. patent application Ser. No. 12/928,986, entitled "CHIP PACKAGE STRUCTURE AND METHOD OF MAKING THE SAME," filed on Dec. 24, 2010, now issued as U.S. Pat. No. 8,294,256, and which is hereby incorporated by reference as if it is set forth in full in this specification, and which also claims the benefit of Chinese Patent Application No. 201010153314.7, filed on Apr. 16, 2010, which is incorporated herein by reference in its entirety.

FIELD OF THE INVENTION

The present invention generally relates to the field of semiconductor devices. More specifically, embodiments of the present invention pertain to semiconductor packaging.

BACKGROUND

For semiconductor industry, the production of integrated circuits (IC) or "chips" can be divided into three main processes: designing, fabricating, and packaging. The fabrication process can include fabrication of a wafer, formation of integrated circuits therefrom, wafer dicing, and so on. The resulting chip can then be electrically connected to a carrier, such as via one or more pads located on the wafer after the fabrication of chip. For example, the carrier may be a lead frame or package substrate. Both wire bonding and flip-chip bonding can also be utilized to connect the chip to the carrier, such that the pads can be electrically connected to the carrier, thereby forming the chip package structure.

However, conventional approaches to chip packaging may result in relatively poor heat dissipation performance and relatively high trace inductance. Conventional approaches may also take up more silicon area, and also result in difficulties in implementing multi-chip systems.

SUMMARY

Embodiments of the present invention relate to methods of making and using, as well as structures, devices, and/or applications for semiconductor packaging.

In one embodiment, a chip package structure includes: (i) a chip having a plurality of first and second contact pads thereon; (ii) a lead frame having a plurality of pins for external connection to the package structure, where the chip is disposed on the lead frame; (iii) a plurality of first bonding wires for connecting the first contact pads to the lead frame; and (iv) a plurality of second bonding wires for connecting the second contact pads to the plurality of pins on the lead frame.

In another embodiment, a method of packaging a chip includes: (i) providing a chip to be packaged, where the chip includes a plurality of first and second contact pads thereon; (ii) providing a lead frame, where the lead frame includes a plurality of pins for external connection; (iii) disposing the chip on the lead frame; (iv) providing a plurality of first bonding wires for connecting the plurality of first contact pads directly to the lead frame; and (v) providing a plurality of second bonding wires for connecting the plurality of second contact pads to the plurality of pins on the lead frame.

Embodiments of the present invention can advantageously provide a packaging solution with reduced ground bonding wire lengths, reduced silicon area due to crown and switch signal bonding wire interleaving, and multi-chip facilitation. Other advantages of the present invention will become readily apparent from the detailed description of preferred embodiments below.

DETAILED DESCRIPTION

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Embodiments of the present invention can advantageously provide a packaging solution with reduced ground bonding wire lengths, reduced silicon area due to crown and switch signal bonding wire interleaving, and multi-chip facilitation. The invention, in its various aspects, will be explained in greater detail below with regard to exemplary embodiments.

For semiconductor package using a lead frame as its chip carrier, such as quad flat no lead (QFN) and quad flat package (QFP), a fabrication process can include the following: place the chip on one lead frame that has a carrier and one or more pins; connect contact pads on the chip surface to corresponding pins by using bonding wires; and encapsulate the chip and bonding wires with package glue to form a complete semiconductor package. Function pins including ground, power and switch signals are typically included in the design of the package structure to meet electrical requirements, and to ensure electrical character and reduce noise with increasing chip density on the package. A number of wires can be used to respectively connect ground pins, power pins, and switch signal pins of the lead frame to the corresponding ground pads, power pads, and switch pads in many approaches.

Generally, a QFN package offers a variety of benefits, such as a reduced lead inductance, a small sized "near chip scale" footprint, a relatively thin profile, and relatively low weight. The QFN package also uses peripheral I/O pads to ease PCB trace routing, and exposed copper die-pad technology offers good thermal and electrical performance.

Figure 1A:
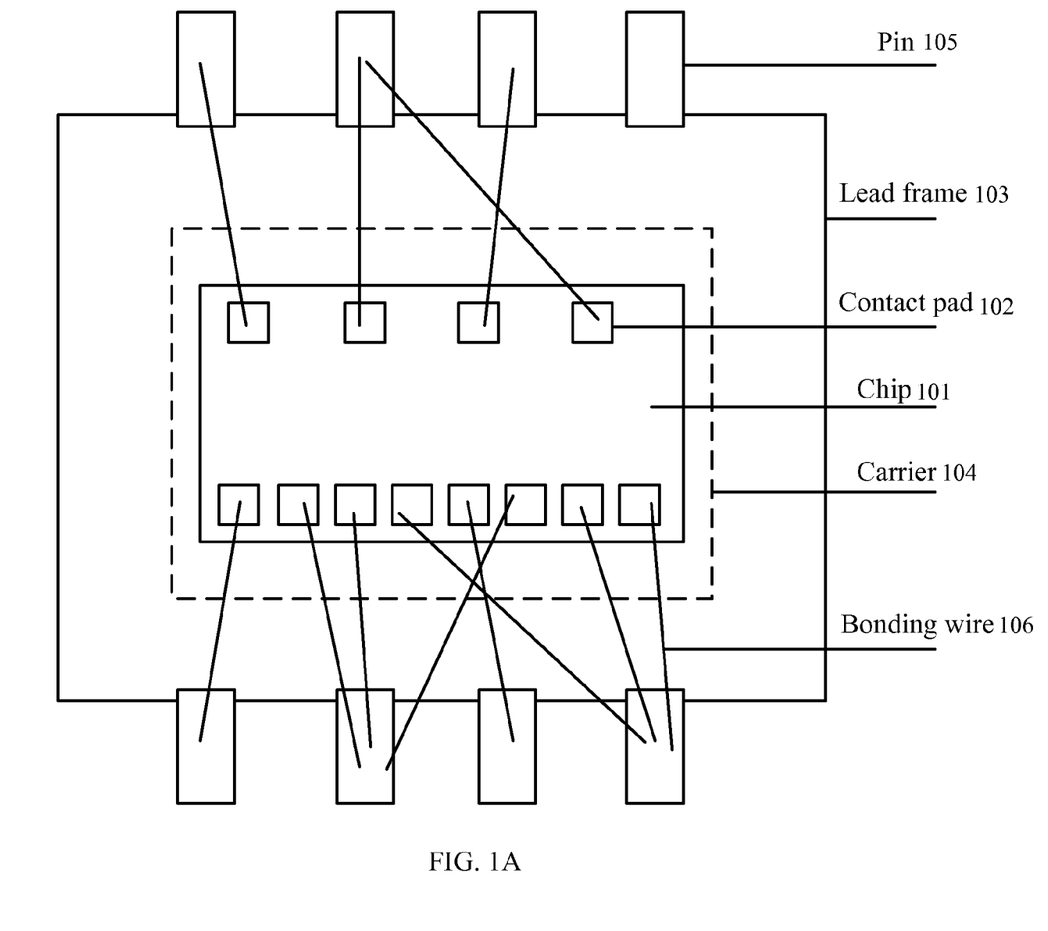
FIG. 1A is an example diagram of a single-chip package structure.

FIG. 1A shows one example of a single chip package structure, from a schematic top view. As shown in FIG. 1A, the package includes chip 101, lead frame 103 and various bonding wires. Chip 101 can be placed on carrier 104 of lead frame 103, with bonding wires 106 electrically connecting contact pads 102 on chip 101 to corresponding external pins 105 across carrier 104. Chip 101 can include ground pads, power pads, and signal pads, which can be connected to corresponding pins 105 of lead frame 103. The length of ground wires can be extended in this configuration, leading to an increase in wire resistance and power dissipation for chip 101. The arrangement of contact pads 102 of chip 101 and pins 105 of lead frame 103 may cause mutual crossing among various bonding wires, thus making more complicated wire connection operation, and increased interference among each other. Reliability and stability of chips can thus be decreased in this chip package module, and increased silicon area may be needed for chip assembly process.

Figure 1B:
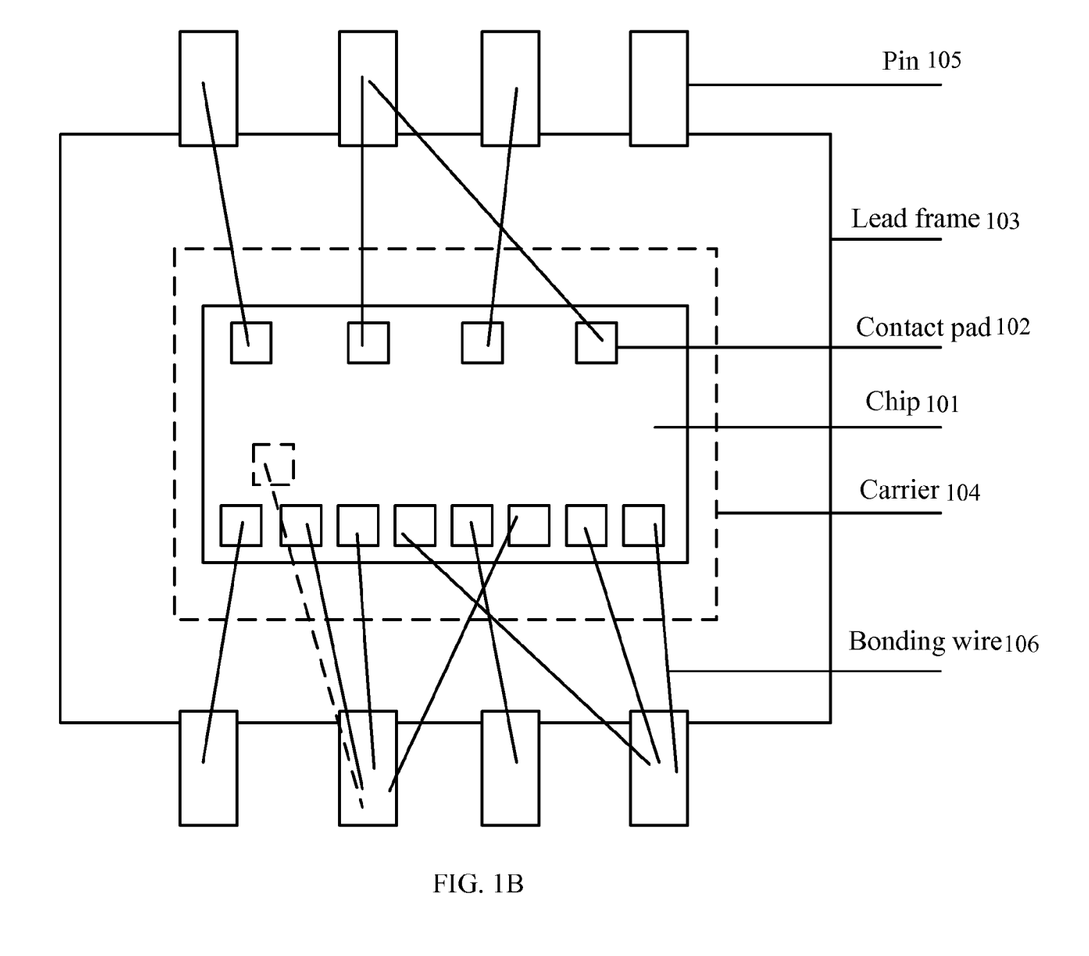
FIG. 1B is an example diagram of an extension of the single-chip package as shown in FIG. 1A.

Referring now to FIG. 1B, shown is an example package suitable for multi-chip (or additional chip portion) package systems. This top view depicts that IC circuitry design and arrangement (e.g., additional contact pads) may need a redesign if the multi-chip or multi-chip portion system is built on the basis of such an underlying single-chip package. The arrangement for contacts pads 102 and bonding wires 106 may thus be more complex, resulting in more silicon area.

In particular embodiments, a chip package structure may provide relatively low power loss, relatively fewer bonding wires, improved heat dissipation performance, and relatively low cost manufacturing. Further, extension to multi-chip packaging systems can also be facilitated from such an approach.

In particular embodiments, ground wire length can be reduced when ground contact pads with a substantially same potential (e.g., voltage level) are connected directly to a lead frame, thereby reducing wire resistance and associated power loss. Also in particular embodiments, clearance between ground bonding wires and carrier of the lead frame can be reduced to maintain higher heat dissipation performance. In this manner, the heat can be transferred directly to the lead frame through, e.g., ground bonding wires, resulting in less thermal resistance to ensure better heat dissipation.

For power management ICs, their performance frequency can be set by external capacitors and resistors. In particular embodiments, an external capacitor can be directly connected between a power pin and a ground loop of the lead frame, thereby minimizing capacitor loop and connection wires. This can minimize trace inductance to ensure the stability and reliability of the ICs, as well as reduce IC or chip stress.

Also in particular embodiments, ground bonding wires and switch signal bonding wires can be arranged in an interleaved fashion, and/or in parallel, which can result in reduced silicon area consumption. Further, particular embodiments can facilitate extension of chips into multi-chip systems and/or chips with additional portions or functions (e.g., from an IP library) by the addition of contacts pads with a same arrangement principle as the original or existing chip, and substantially without complex wire connection additions.

In one example, a chip package structure includes: (i) a chip having a plurality of first and second contact pads thereon; (ii) a lead frame having a plurality of pins for external connection to the package structure, where the chip is disposed on the lead frame; (iii) a plurality of first bonding wires for connecting the first contact pads to the lead frame; and (iv) a plurality of second bonding wires for connecting the second contact pads to the plurality of pins on the lead frame.

Figure 2:
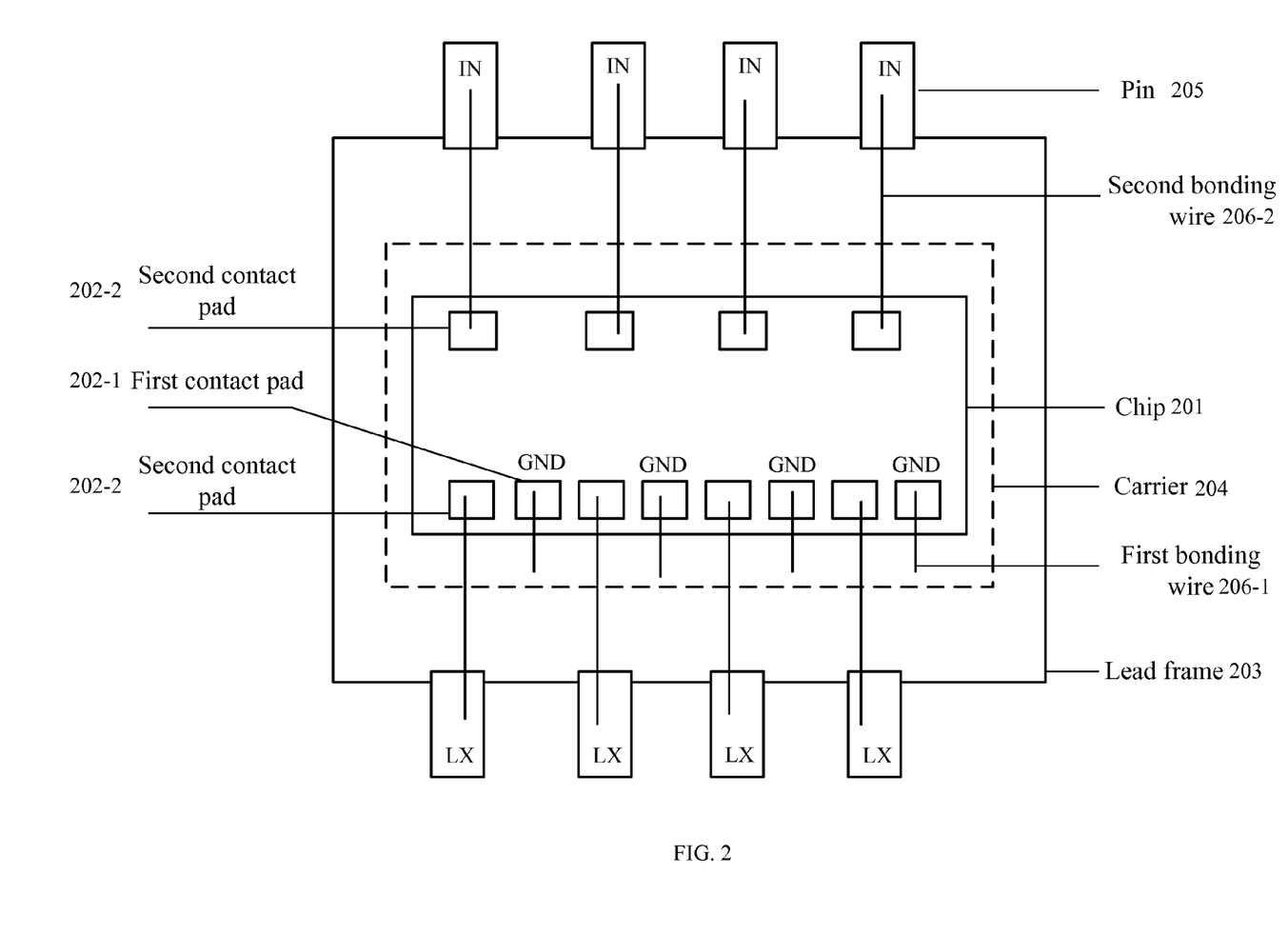
FIG. 2 is an example diagram of a chip package in accordance with embodiments of the present invention.

Referring now to FIG. 2, shown is an example chip package structure in accordance with embodiments of the present invention. This particular example includes chip 201, lead frame 203, first bonding wire 206-1, and second bonding wire 206-2. First contact pads 202-1, and second contact pads 202-2 are arranged on an edge or side of chip 201 to facilitate the wire bonding process. First contact pads 202-1 may be directly/electrically connected to lead frame 203 through first bonding wires 206-1, while second contact pads 202-2 are connected to a plurality of pins 205 (e.g., IN, LX), which may be contained in lead frame 203 as traces for external connection from the chip package. As one skilled in the art will recognize, an encapsulation can encapsulate the chip, the first and second contact pads, and a portion of said lead frame, where the pins of the lead frame may be exposed outside of the encapsulation.

With increased IC/chip density for chip packages, design and arrangement of the package structure, ground pins (e.g., GND), power pins (e.g., IN), and switch signal pins (e.g., LX) for chip 201 is important to ensure electrical performance and low noise. In this particular example, first contact pads 202-1 are ground pads, and second contact pads 202-2 are power pads and switch signal pads. As one skilled in the art will recognize, first bonding wires 206-1 connecting the ground pads to lead frame 203 are ground wires, and some of the second bonding wires 206-2 connecting the power pads to power pins on the lead frame are power wires. Also, other or remaining second bonding wires 206-2 connecting the switch signal pads to switch pins on the lead frame are switch signal bonding wires. Ground wires and switch signal wires may be arranged on the same side of lead frame 203 and interleaved with each other, while power wires can be located at the opposite side of lead frame 203 relative to the ground and switch signal wires. Correspondingly, ground pads and switch pads may be arranged on the same side of chip 201 and interleaved with each other, while power pads can be arranged at the opposite side of chip 201.

Figure 3:
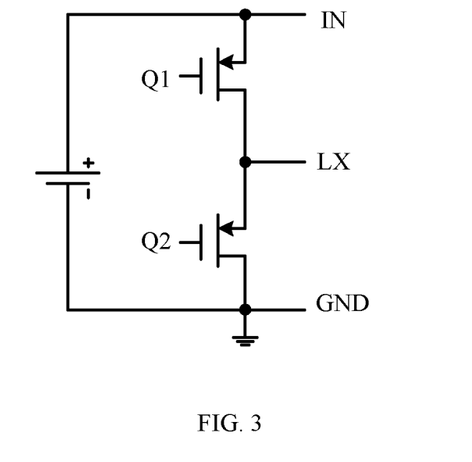
FIG. 3 is a schematic diagram of example circuitry suitable for use in the package structure of FIG. 2.

As depicted in FIG. 3, a schematic diagram for a power management or voltage regulator chip example is provided. This particular power management circuit includes top switch Q1, bottom switch Q2, power supply IN and ground GND. Power pins, ground pins, and switch pins are thus accommodated in its package in order to meet electrical characteristics. For example, the power management circuit of FIG. 3 can be implemented in the package structure example shown in FIG. 2.

Following this example, power pads may be connected to corresponding power pins 205 directly across the lead frame through second bonding wires 206-2 that are power wires. This is illustrated in a top portion of FIG. 2. Switch pads may be connected to corresponding switch pins 205 directly across the lead frame through second bonding wires 206-2 that are switch bonding wires. This is illustrated in a bottom portion of FIG. 2.

Aside from the power pins and switch pins being arranged on the lead frame, ground connections can be made. For example, ground pads can be connected directly to lead frame 203 through first bonding wires 206-1 that are ground wires. Thus, ground connections may be direct connections to the lead frame, while other connections may essentially pass through (or over/under) the lead frame using bonding wires. This is also illustrated in a bottom portion of FIG. 2. In this fashion of connecting ground bonding wires, ground bonding wire length can be reduced, thereby reducing associated wire resistance and chip power dissipation.

In addition, heat dissipation may be improved in certain embodiments due to less space existing between ground pads and carrier 204 on the lead frame. This direct connection between ground pads and lead frame also facilitates the transfer of heat to lead frame 203 through the ground bonding wires. As a result, thermal resistance is lowered and better heat dissipation can be achieved.

Switch signal bonding wires and ground bonding wires may also be disposed on the same side (e.g., the bottom side in the example orientation of FIG. 2) of lead frame 203, while power wires can be disposed on an opposite side (e.g., the top side in the example orientation of FIG. 2). In addition, switch bonding wires (e.g., LX connections) and ground bonding wires (e.g., GND connections) may be interleaved with each other.

Operation frequency of a chip (e.g., power management chips, regulator chips, etc.) in such a package can be modulated by external resistors and capacitors. For example, an external capacitor can be connected between power pins (e.g., IN) and carrier 204 on lead frame 203. As a result, capacitor loop and wires can be minimized to reduce an overall size of the chip package structure.

Voltage stress on the chip can be calculated as shown below in equation (1):

$$V = L \cdot \frac{di}{dt} \quad (1)$$

Because a shorter bonding wire length can result in trace inductance, the voltage stress is also reduced. This also allows for improved extensions over existing IC designs, relative to approaches of examples shown in FIGS. 1A and 1B, which may require circuits and layout to be re-designed for improved optimization.

Figure 4:
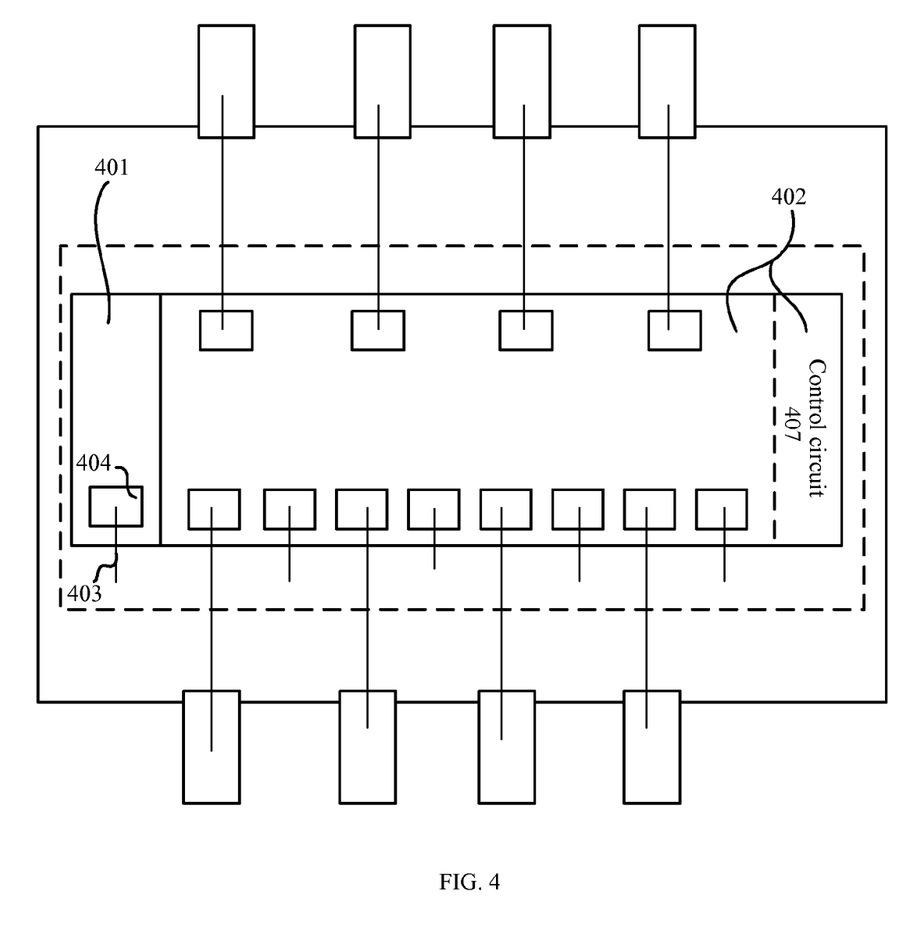
FIG. 4 is an example diagram of extension of a single-chip package in accordance with embodiments of the present invention.

Referring now to FIG. 4, shown is an example package structure suitable for IC extension to an original IC in accordance with embodiments of the present invention. In this example, extension 401 is added to original or existing chip 402 (which includes control circuit portion 407). Here, silicon portion 401 can be added along a side of original chip structure 402, and corresponding bonding wires 403 and contact pads 404 can also be added and arranged in a similar fashion as the originals/existing contact pads and bonding wires (see, e.g., FIG. 2). Thus, there is no substantial effect to the existing arrangement for bonding wires and contact pads.

As shown in the particular example of FIG. 4, chip 402 includes ground, power, switch pins, as well as control circuit portion 407. Ground, power, and switch signal pins may be arranged for packaging as discussed above with reference to FIG. 2. Silicon extension portion 401 can be added and disposed along a side of original chip 402 (e.g., a left side in the example orientation of FIG. 4). Additional bonding wires 403 and contact pads 404 can be arranged on the added silicon portion 401, following the same connection mode or arrangement as the originals (e.g., consistent with those shown in FIG. 2).

In another embodiment, a method of packaging a chip includes: (i) providing a chip to be packaged, where the chip includes a plurality of first and second contact pads thereon; (ii) providing a lead frame, where the lead frame includes a plurality of pins for external connection; (iii) disposing the chip on the lead frame; (iv) providing a plurality of first bonding wires for connecting the plurality of first contact pads directly to the lead frame; and (v) providing a plurality of second bonding wires for connecting the plurality of second contact pads to the plurality of pins on lead frame.

Figure 5:
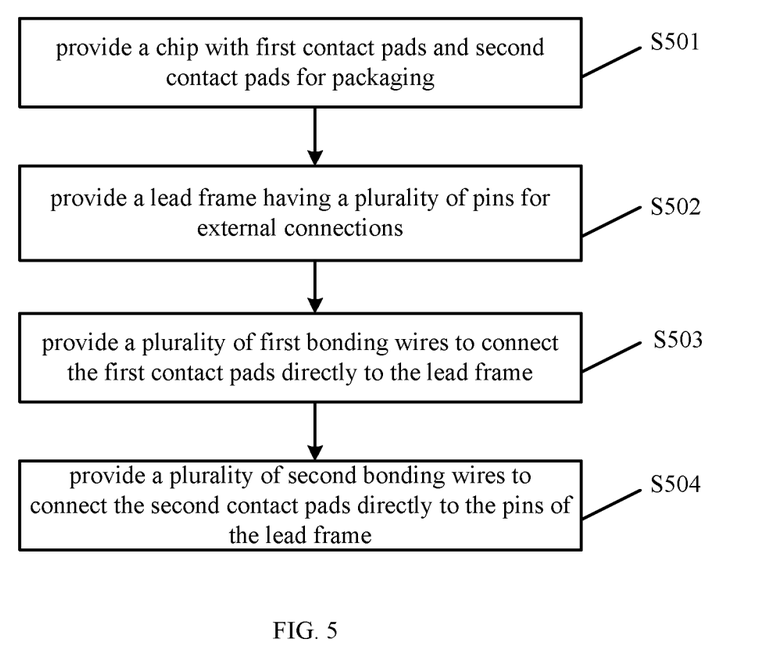
FIG. 5 is a flow chart of a first example chip packaging method in accordance with embodiments of the invention.

Referring now to FIG. 5, shown is a flow chart of a first example method of chip packaging in accordance with embodiments of the present invention. In S501, a chip including first contact pads and second contact pads for packaging can be provided. In S502, a lead frame having a plurality of pins for external connection may be provided. In S503, a plurality of first bonding wires to connect the first contact pads directly to the lead frame can be provided. In S504, a plurality of second bonding wires for direct connection of the second contact pads to the pins of the lead frame can be provided.

Figure 6:
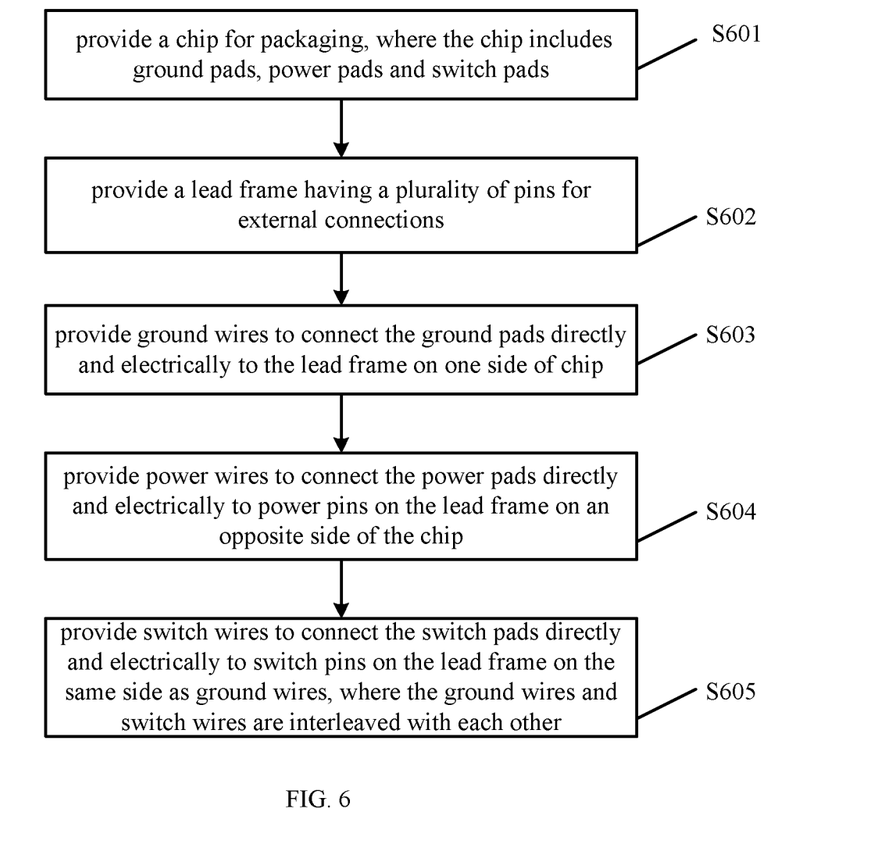
FIG. 6 is a flow chart of a second example chip packaging method in accordance with embodiments of the invention.

Referring now to FIG. 6, shown is a flow chart of a second example method of chip packaging in accordance with embodiments of the present invention. In S601, a chip for packaging is provided, where the chip includes ground pads, power pads and switch signal pads. In S602, a lead frame having a plurality of pins for external connection is provided. In S603, ground bonding wires for connecting the ground pads directly to the lead frame on one side of chip are provided. In 604, power bonding wires to connect the power pads directly to power pins on the lead frame on an opposite side of the chip, are provided. In S605, switch bonding wires to connect the switch signal pads directly to switch signal pins on the lead frame on the same side as the ground wires is provided. Further, the ground bonding wires and the switch bonding wires may be interleaved with each other.

Transistors on semiconductor chips as described herein can include any suitable type of transistor, such as a lateral double-diffused metal oxide semiconductor (LDMOS) transistor. The lead frame materials can be any suitable material (e.g., Cu alloy, etc.). Also, a package in particular embodiments can be a QFN, a dual flat no leads (DFN), or any other suitable package. Further, bumps or bumping balls instead of bonding wires for connection between lead fingers or lead frame and the chip, can be formed using any suitable technology (e.g., Cu-pillar, solder, electroless nickel/immersion gold (ENIG), etc.).

For example, a thickness of a lead frame can range from about 0.05 mm to about 0.2 mm (e.g., about 0.075 mm, about 0.15 mm, etc.). In some particular applications, lead frames in particular embodiments may be independent of a substrate, a via therein, or other PCB layers for forming connections between a semiconductor die and a system PCB. A flip-chip package (e.g., QFN, DFN, etc.) can also be used to encapsulate a monolithic voltage regulator, bumps, lead frame, etc., in certain embodiments.

While the above examples include arrangement and structural implementations of chips, packages and lead frames, one skilled in the art will recognize that other technologies and/or structures can be used in accordance with embodiments. For example, bonding wire and pad arrangements can be changed in particular embodiments. Further, one skilled in the art will recognize that other device cross-section and/or top view arrangements, other lead frame designs and patterns, other chip orientations and designs (e.g., current regulators), other types and numbers of pins and terminals, such as for external connections, etc., and other types of packages and the like, may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A chip package structure, comprising:
   a) a chip having a plurality of first contact pads comprising ground pads for operation at substantially a same potential, and a plurality of second contact pads comprising switch pads for operation at variable potentials, and power pads for operation at substantially a same potential;
   b) a lead frame having a plurality of pins for external connection to said package structure, wherein said chip is disposed on said lead frame;
   c) a plurality of first bonding wires comprising ground bonding wires and being configured to connect said first contact pads directly to said lead frame without connecting to one of said plurality of pins; and
   d) a plurality of second bonding wires comprising switch signal bonding wires and being configured to connect said second contact pads to said plurality of pins on said lead frame, wherein other bonding wires connected to said power pads on said chip comprise power bonding wires.

2. The chip package structure of claim 1, wherein:
   a) said switch signal bonding wires and said ground bonding wires are arranged on a first side of said lead frame; and
   b) said power bonding wires are arranged on a second side of said lead frame, said second side being opposite to said first side on said lead frame.

3. The chip package structure of claim 2, wherein said switch signal bonding wires and said ground bonding wires are interleaved with each other.

4. The chip package structure of claim 1, further comprising an encapsulation configured to encapsulate said chip, said pluralities of first and second contact pads, and at least a portion of said lead frame, wherein said pins of said lead frame are exposed outside of said encapsulation.

5. The chip package structure of claim 4, further comprising a second chip in said encapsulation in a same multi-chip package.

6. The chip package structure of claim 1, further comprising an external capacitor connected between a power pin and said lead frame.

7. The chip package structure of claim 1, wherein said chip comprises:
   a) a top switch coupled to at least one of said power pads and at least one of said switch pads; and
   b) a bottom switch coupled to said at least one of said switch pads and at least one of said ground pads.

8. The chip package structure of claim 7, wherein each of said top and bottom switches comprises a transistor.

9. The chip package structure of claim 8, wherein said transistor comprises a lateral double-diffused metal oxide semiconductor (LDMOS) transistor.

10. The chip package structure of claim 1, wherein said lead frame comprises a copper alloy.

11. The chip package structure of claim 1, wherein a thickness of said lead frame is in a range of from about 0.05 mm to about 0.2 mm.

12. An apparatus, comprising:
   a) means for providing a chip to be packaged, said chip comprising a plurality of first contact pads comprising ground pads for operation at substantially a same potential, and a plurality of second contact pads comprising switch pads for operation at variable potentials, and power pads for operation at substantially a same potential;
   b) means for providing a lead frame, said lead frame comprising a plurality of pins for external connection to said packaged chip;
   c) means for disposing said chip on said lead frame;
   d) means for connecting, using a plurality of first bonding wires comprising ground bonding wires, said plurality of first contact pads directly to said lead frame without connecting to one of said plurality of pins; and
   e) means for connecting, using a plurality of second bonding wires comprising switch signal bonding wires, said plurality of second contact pads to said plurality of pins on said lead frame, wherein other bonding wires connected to said power pads on said chip comprise power bonding wires.

* * * * *